US010812051B2

(12) United States Patent
Jimenez de Parga Bernal (10) Patent No.: US 10,812,051 B2
(45) Date of Patent: Oct. 20, 2020

(54) METHOD AND SYSTEM FOR A MATCHING CIRCUIT FOR A BROADBAND BUS IN AUTOMOTIVE APPLICATIONS

(71) Applicant: Maxlinear, Inc., Carlsbad, CA (US)

(72) Inventor: Antonio Jimenez de Parga Bernal, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 49 days.

(21) Appl. No.: 16/107,031

(22) Filed: Aug. 21, 2018

(65) Prior Publication Data

US 2019/0068168 A1    Feb. 28, 2019

Related U.S. Application Data

(60) Provisional application No. 62/549,252, filed on Aug. 23, 2017.

(51) Int. Cl.

| H03H 11/28 | (2006.01) |
|---|---|
| H04L 25/08 | (2006.01) |
| H01B 11/10 | (2006.01) |
| H01B 11/00 | (2006.01) |
| H04L 12/40 | (2006.01) |
| H04B 3/54 | (2006.01) |
| H04B 3/30 | (2006.01) |

(52) U.S. Cl.
CPC ........... H03H 11/28 (2013.01); H01B 11/002 (2013.01); H01B 11/10 (2013.01); H04B 3/30 (2013.01); H04B 3/548 (2013.01); H04L 12/40 (2013.01); H04L 25/08 (2013.01)

(58) Field of Classification Search
CPC ......... H03H 11/28; H04L 12/40; H04L 25/08; H04B 3/548; H04B 3/30; H01B 11/00
USPC .............................................. 333/32
See application file for complete search history.

(56) References Cited

U.S. PATENT DOCUMENTS

| 5,734,658 A | * | 3/1998 | Rall | ............. | H04L 12/40006 |
| | | | | | 333/124 |
| 6,484,223 B1 | * | 11/2002 | Lenz | ............. | H04L 25/03834 |
| | | | | | 327/50 |

* cited by examiner

*Primary Examiner* — Robert J Pascal
*Assistant Examiner* — Kimberly E Glenn
(74) *Attorney, Agent, or Firm* — Maschoff Brennan (57) ABSTRACT

Aspects of methods and systems for a matching circuit for a broadband bus in automotive applications are provided and may include a twisted pair wiring bus comprising a main line for coupling two end nodes and one or more stub lines, with each stub line coupling a stub node to the main line via a junction impedance on each wire in the stub line. Electrical signals may be communicated between devices coupled to the end nodes and the stub nodes. A subset of the stub nodes may be coupled to the main line in a star configuration. The junction impedance may comprise a resistor on each wire in the stub line where the resistor may have a resistance that is two to three times a nominal impedance of the main line. The junction impedance may comprise a resistor in parallel with an inductor on each wire in the stub line.

20 Claims, 14 Drawing Sheets

METHOD AND SYSTEM FOR A MATCHING CIRCUIT FOR A BROADBAND BUS IN AUTOMOTIVE APPLICATIONS

CROSS-REFERENCE TO RELATED APPLICATIONS/INCORPORATION BY REFERENCE

This application claims priority to U.S. Provisional Application 62/549,252, filed on Aug. 23, 2017, which is hereby incorporated herein by reference in its entirety.

TECHNICAL FIELD

Certain embodiments of the invention relate to automotive communication. More specifically, certain embodiments of the invention relate to a matching circuit for a broadband bus in automotive applications.

BACKGROUND

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

System and/or methods pertaining to a matching circuit for a broadband bus in automotive applications, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
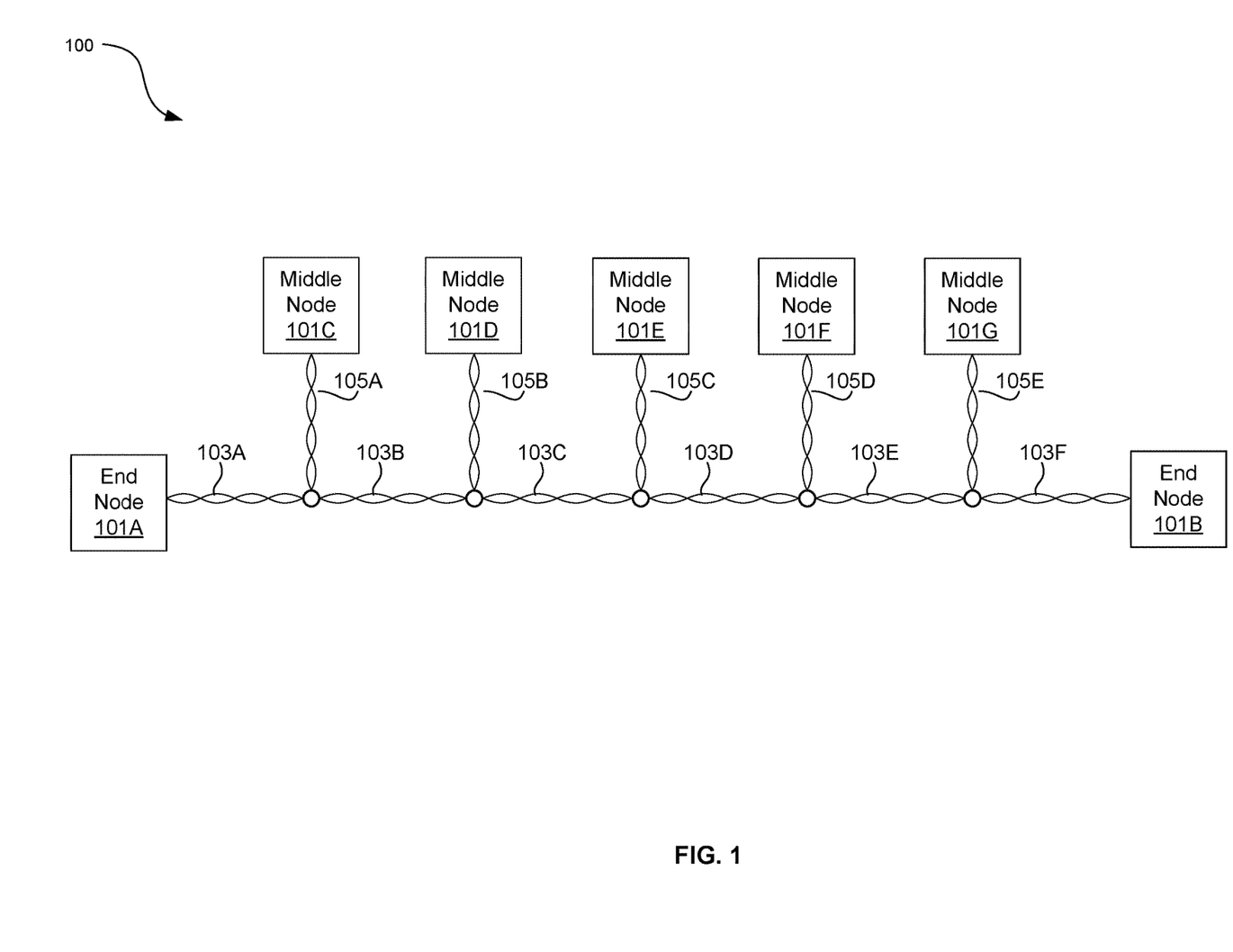
FIG. 1 depicts an example node coupling topology in a typical automotive bus application, in accordance with an example implementation of this disclosure.

FIG. 1 depicts an example node coupling topology in a typical automotive bus application, in accordance with an example implementation of this disclosure. Referring to FIG. 1, there is shown linear wiring topology 100 comprising segments 103A-103F and stubs 105A-105E, all of which are used to interconnect the nodes 101A-101G.

In an example automotive embodiment, the end nodes 101A and 101B may comprise main system controllers, for example, and the stub nodes 101C-101G may comprise input devices such as sensors, cameras, or other devices that provide input to the controllers. To approximate a typical automotive application, the total length of the twisted pair from end nodes 101A to 101B may be 15 meters and the stubs may each be about 20 cm, all comprising 22 gauge wire for the bus characterization of FIG. 2. Other lengths and gauge wires are possible.

Automotive manufacturers need a high-speed bus with minimal wiring and flexible number of nodes. Automotive Ethernet is not flexible because the size of the switch changes depending on the installed options and the expandability is limited as hardware must be set up to begin with in manufacturing, and a concentrator is needed. Automotive applications have typically used a bus, comprising a linear bus with stubs using a single twisted pair, as shown in FIG. 1, and carrying only data, but with limited speed.

Figure 2:
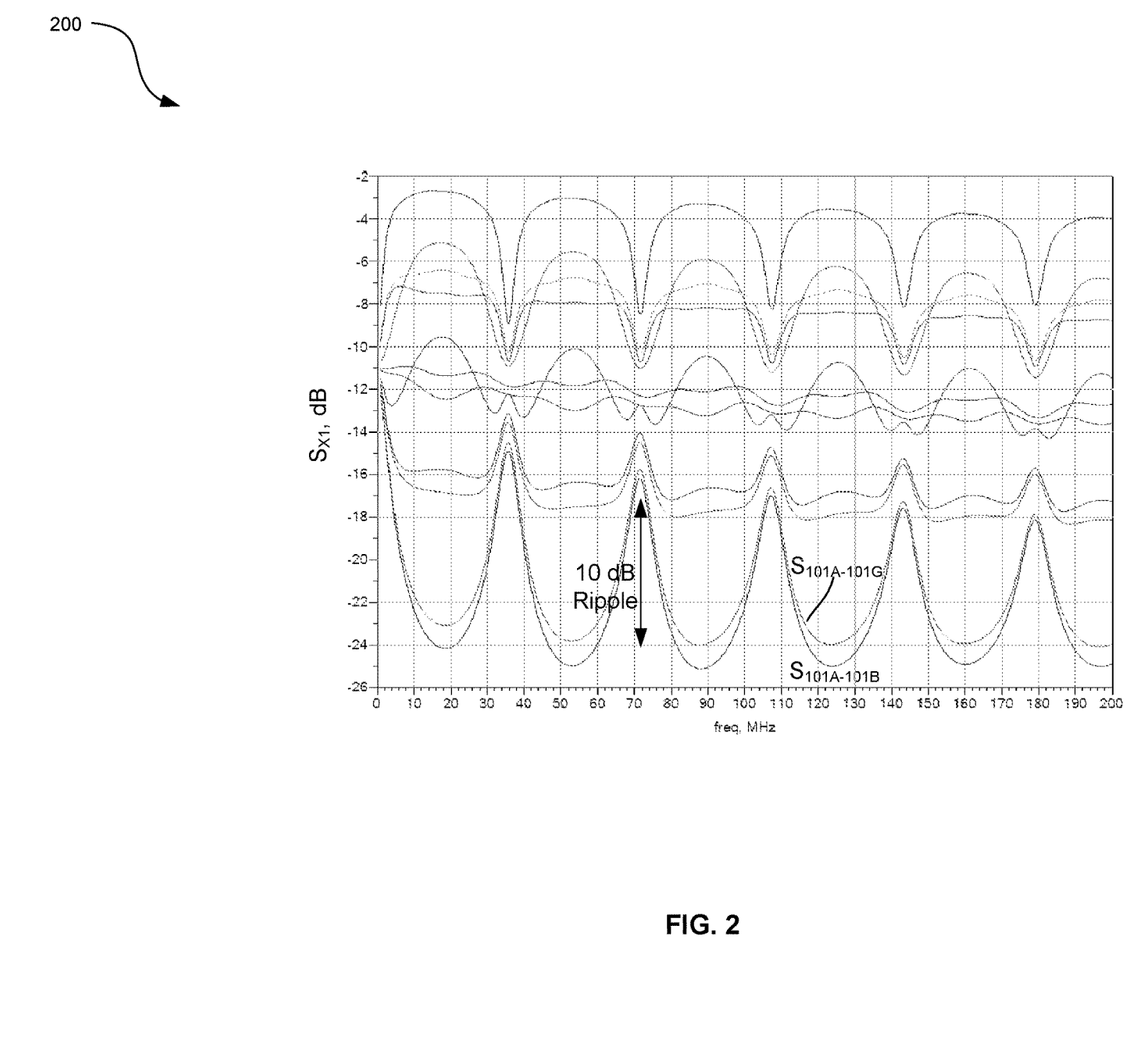
FIG. 2 illustrates the S-parameters for a 15 meter twisted pair bus with stubs directly connected to the main line, in accordance with an example embodiment of the disclosure.

FIG. 2 illustrates the S-parameters for a 15 meter twisted pair bus with stubs directly connected to the main line, in accordance with an example embodiment of the disclosure. Referring to FIG. 2, there is shown a frequency response for signals between each pair of nodes with the length of each segment between nodes being 2.5 m and the stub length being 20 cm. As shown in the plots, the largest ripple is exhibited for the longest distance paths, namely nodes 101A to 101B and 101A to 101G, showing about 10 dB of ripple, which is generally unacceptable for high speed operation. Furthermore, attenuation ranges from 3 to 25 dB. This results in very different OFDM bit-loading for each node resulting in unpredictable speed. Regardless the type of modulation used, the signal degrades along the bus in this configuration.

Figure 3A:
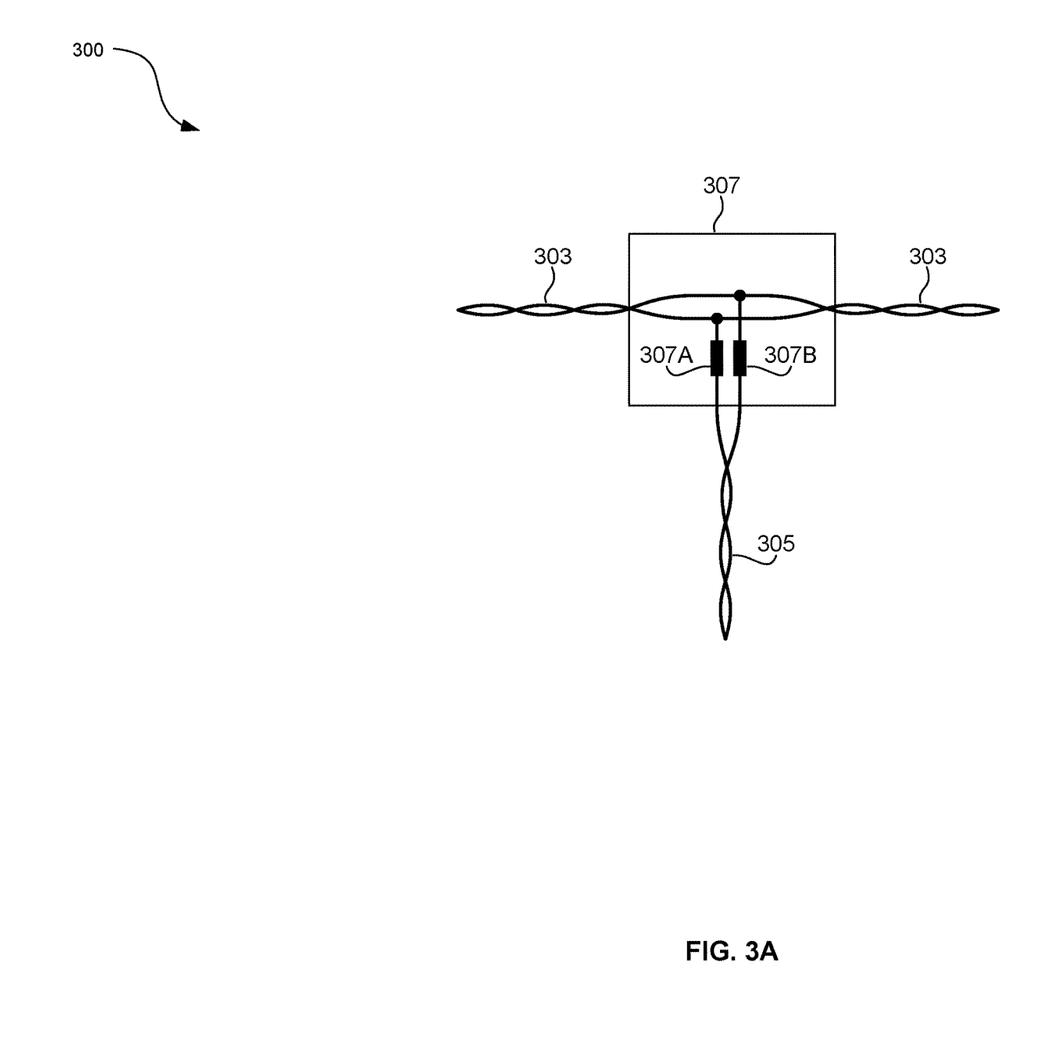
FIG. 3A illustrates a stub to a twisted pair bus with junction impedance, in accordance with an example embodiment of the disclosure.

FIG. 3A illustrates a stub to a twisted pair bus with junction impedance, in accordance with an example embodiment of the disclosure. Referring to FIG. 3A, there is shown a twisted pair bus 300 with a junction 307 between the main line 303 and a stub 305. As shown in FIG. 3A, the junction 307 may comprise resistors 307A and 307B with the stub line 305 for coupling to the main line 303.

The resistances 307A and 307B may not comprise "matching" impedances necessarily, but are such that they mitigate a particular stub's mismatch with the main line 303, and reduce noise in the bus 300. In other words, the main line 303 of the bus 300 may be matched to node devices while the stubs 305 are not, but the stubs are generally short. The main line 303 is quasi matched for end nodes, and each stub is quasi matched between the corresponding node and the impedance. In an example scenario, the resistors may each be in the 200-300 Ohm range, or about 2-3× the nominal impedance of the bus 300. There is a tradeoff between better matching and lower attenuation to stub nodes.

As each of the devices at the nodes in the bus are powered from the same source and ground, AC coupling of devices is possible and there is no need for transformers to couple devices via the stubs. While resistors 307A and 307B are shown in the junction 307, other types of impedances may be utilized such as inductors, capacitors, and also may be variable depending on the impedance of the stub 305 and/or node devices.

Figure 3B:
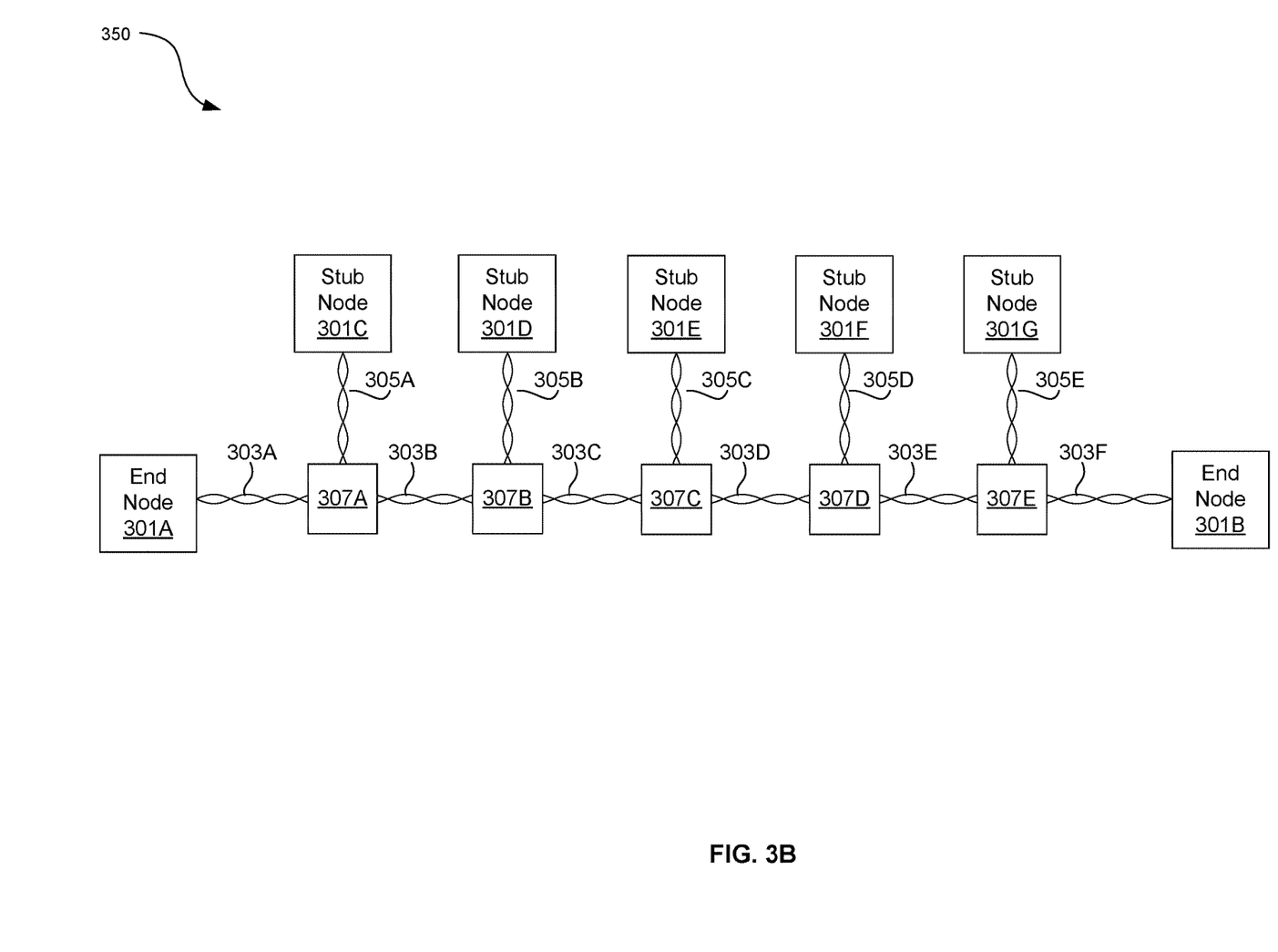
FIG. 3B illustrates a twisted pair bus with junction impedance, in accordance with an example embodiment of the disclosure.

FIG. 3B illustrates a twisted pair bus with junction impedance, in accordance with an example embodiment of the disclosure. Referring to FIG. 3B, there is shown linear wiring topology 350 comprising segments 303A-303F and stubs 305A-305E, all of which are used to interconnect the nodes 301A-301G, comprising end nodes 301A and 301B and stub nodes 301C to 301G. As in FIG. 1, the end nodes 301A and 301B may comprise main system controllers, for example, and the stub nodes 301C-301G may comprise input devices such as sensors, cameras, or other devices that provide input to the controllers. If only one system controller is utilized, the other one may be replaced with a termination impedance, which may comprise one or more passive, such as resistors, inductors, or capacitors, or active devices, such as diodes, between the lines and ground, for example.

FIG. 3B also shows junction impedances 307A-307E, which may comprise a pair of resistors, as shown in FIG. 3A. In an example scenario, impedances may also be included at the end nodes 301A and 301B. To approximate a typical automotive application, the total length of the twisted pair from end nodes 301A to 301B may be 15 meters, as in a car, and the stubs may each be about 20 cm, all comprising 22 gauge wire for the bus characterization of FIG. 4.

Figure 4:
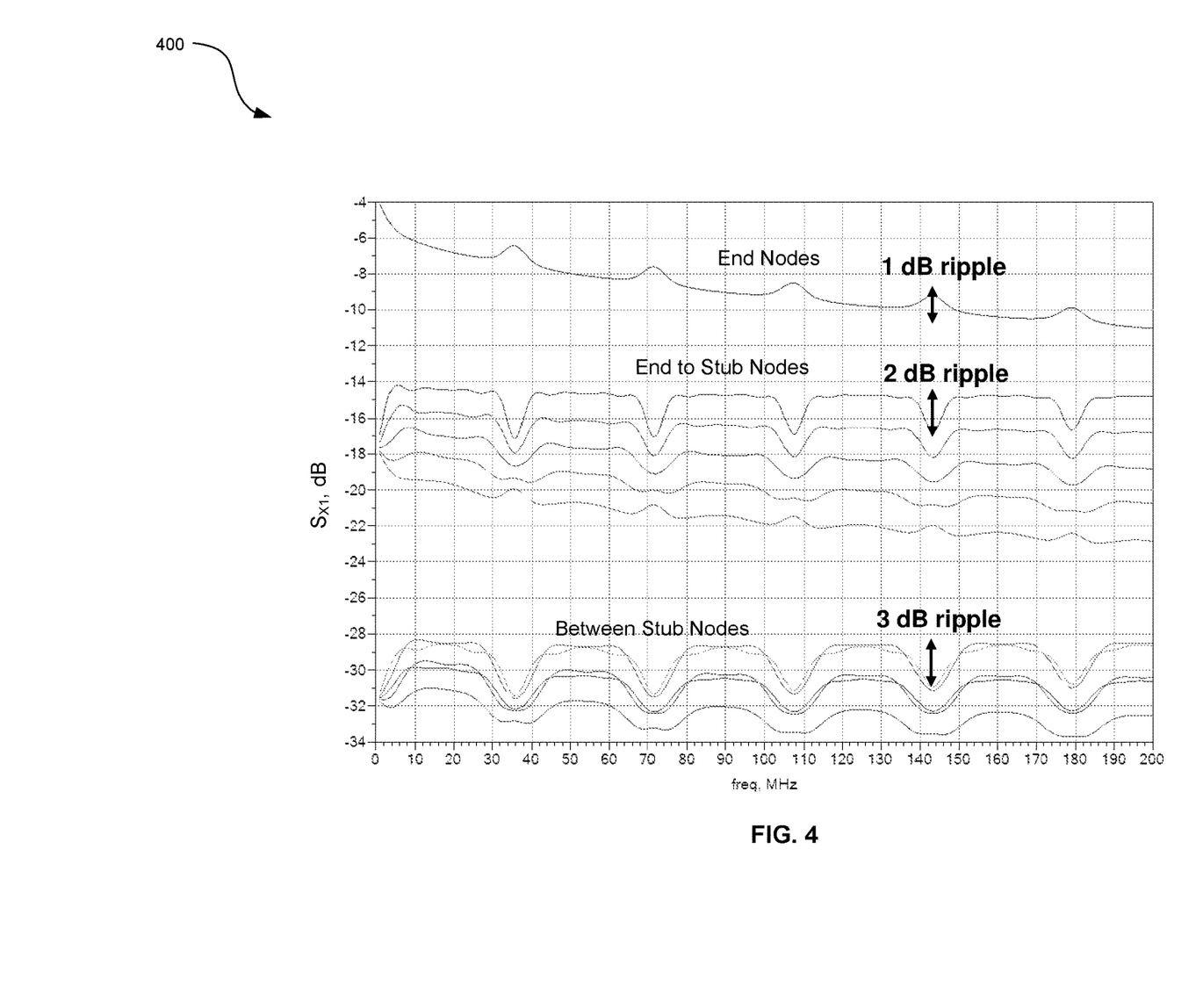
FIG. 4 illustrates the frequency response of a twisted pair bus with junction impedances for each stub, in accordance with an example embodiment of the disclosure.

FIG. 4 illustrates the frequency response of a twisted pair bus with junction impedances for each stub, in accordance with an example embodiment of the disclosure. Referring to FIG. 4, there is shown the frequency response for each node pair, with the lengths being the same as for FIGS. 1 and 2, but with the junction impedances 307A-307E, as shown in FIGS. 3A and 3B. As shown in the plots, the ripple is greatly reduced as compared to the bus of FIGS. 1 and 2, and is lowest between end nodes, slightly higher for end to stub nodes, and higher for between stub nodes.

In addition, the loss increases from a minimum for end node, to end node to stub nodes, and highest for stub to stub, i.e., between stub nodes. The slope in the response curves may be compensated using equalizers at each node, such as a one-pole filter equalizer, for example, depending on the characteristics of the cable. The equalizers may be adjustable with a sqrt(f) profile and adjustable scaling. The speed of the bus shown in FIGS. 3A, 3B, and 4 is comparable to Gigabit Ethernet, while using the G.hn protocol, for example, which utilizes orthogonal frequency division multiplexing (OFDM).

The G.hn protocol is typically used in home networking with data rates in the 1 GB/sec range using legacy wiring such as telephone lines, coaxial cables, and power lines. G.hn specifies a single physical layer based on fast Fourier transform (FFT) OFDM modulation and low-density parity-check code (LDPC) forward error correction (FEC) code. G.hn includes the capability to notch specific frequency bands to avoid interference with amateur radio bands and other licensed radio services and includes mechanisms to avoid interference with other wireline communication technologies.

As shown, in FIG. 4, the ripple of the different paths ranges from 1 to 3 dB, as a result of stub impedance and bus dimensions, and is subject to tradeoff. RMS automatic gain control (AGC) scaling may be utilized to tune the gain to maximize the use of ADC dynamic range. The attenuation between the various nodes has three cases: 1) end node to end node, which exhibits 4-12 dB, meaning full G.hn speed is achievable; 2) end node to stub nodes, exhibiting ~12-22 dB, which is still better than the worst case of direct attachment of FIGS. 1 and 2, and capable of full speed under G.hn; and 3) stub node to stub node, with 28-34 dB, which may result in some speed degradation, depending on the background noise. These values are representative of the example shown in FIG. 3B.

Therefore, the bus architecture shown in FIGS. 3A and 3B, with frequency response shown in FIG. 4, is highly capable of full-speed master-slave networks, without resorting to more complicated Ethernet networks. Furthermore, sideward communication between slave devices is possible.

In automotive applications, the assessment of signal strength is based on the maximum attenuation of the cable harness, radiation immunity requirements, common-mode to differential-mode conversion in twisted pair technology, electromagnetic interference (EMI) requirements, and the power budget for OFDM nodes. The assessment of logical topology is based on the data requirements for each node, the roles of the nodes (i.e., processor or sensor), and construction of the vehicle. Furthermore, in practical applications, the master node is not likely to be at the end of the line, so matched splitters may be utilized.

Figure 5:
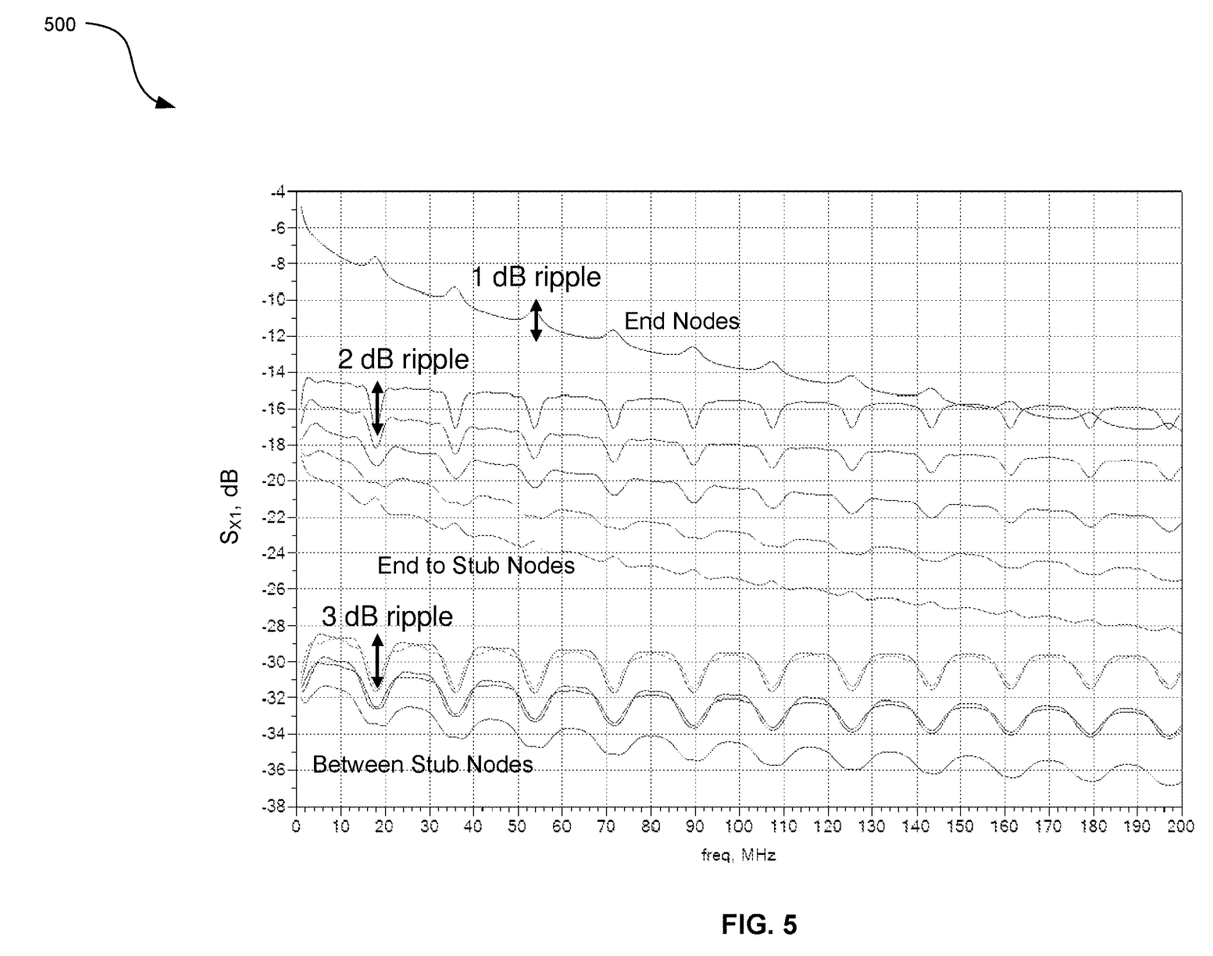
FIG. 5 illustrates the frequency response for a 30 meter bus with 20 centimeter stubs, in accordance with an example embodiment of the disclosure.

FIG. 5 illustrates the frequency response for a 30 meter bus with 20 centimeter stubs, in accordance with an example embodiment of the disclosure. The stubs have a 5 meter separation in this example, which may correspond to a bus or trailer. Referring to FIG. 5, there is shown frequency response plot 500 with response curves between each of the nodes, with the ripple being similar to the 15 meter embodiment shown in FIG. 4, but with more notches and higher droop versus frequency. As with the previous structure, equalizers may be utilized at the nodes to compensate for the slope in the curves. Furthermore, the speed degradation is similar to the 15 meter embodiment, with the lowest attenuation between end nodes and the highest attenuation between stub nodes.

Figure 6:
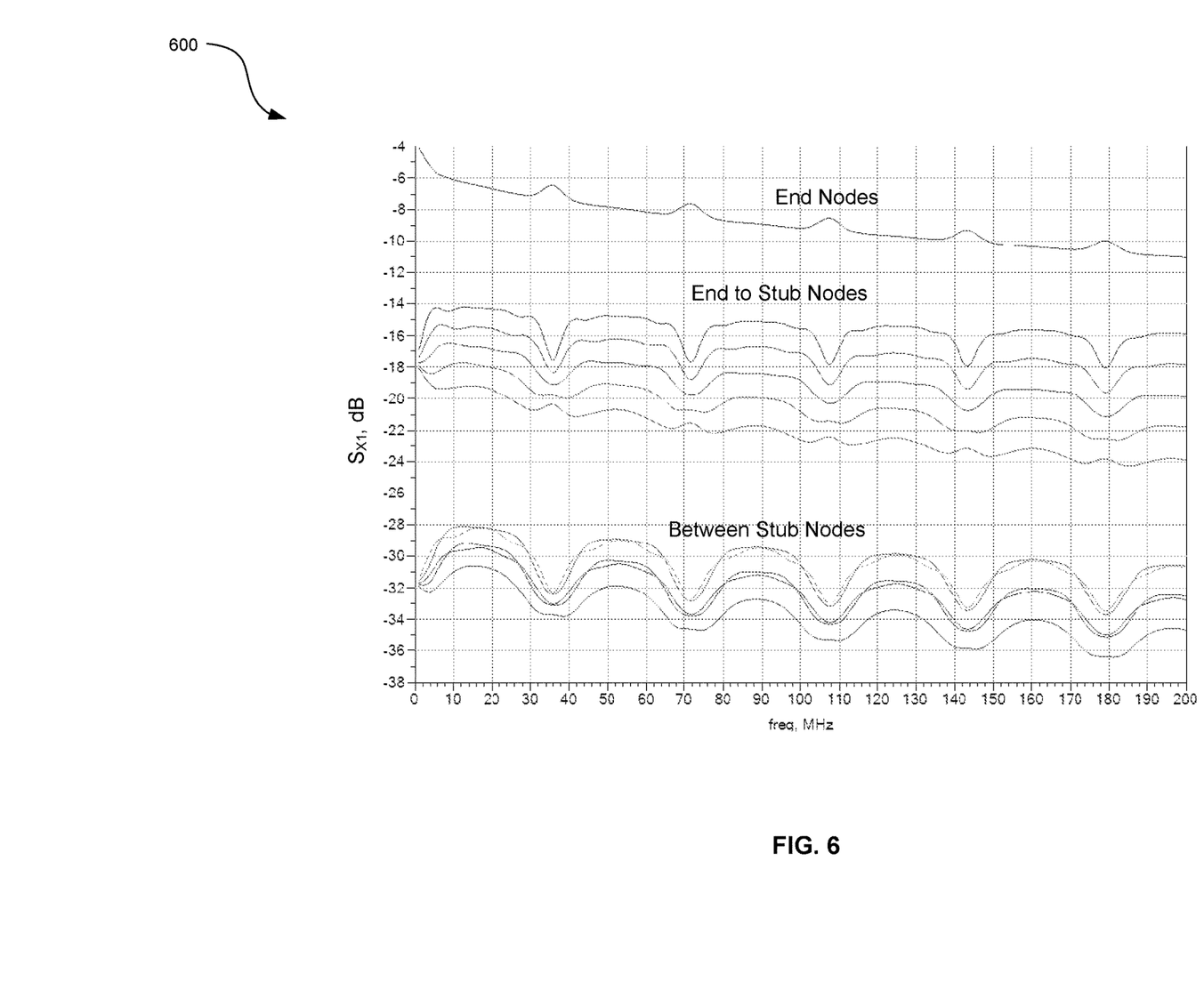
FIG. 6 illustrates the frequency response for a 15 meter bus with 2.5 meter stubs, in accordance with an example embodiment of the disclosure.

FIG. 6 illustrates the frequency response for a 15 meter bus with 2.5 meter stubs, in accordance with an example embodiment of the disclosure. Referring to FIG. 6, there is shown frequency response plot 600 with response curves for connections between each of the nodes, with the ripple being the similar to a 6 meter embodiment with shorter stubs. As with the previous structures, equalizers may be utilized at the nodes to compensate for the slope in the curves. Furthermore, the speed degradation is similar to the previous embodiments, with the lowest attenuation between end nodes and the highest attenuation between stub nodes. Ripple again ranges from 1-3 dB.

Figure 7:
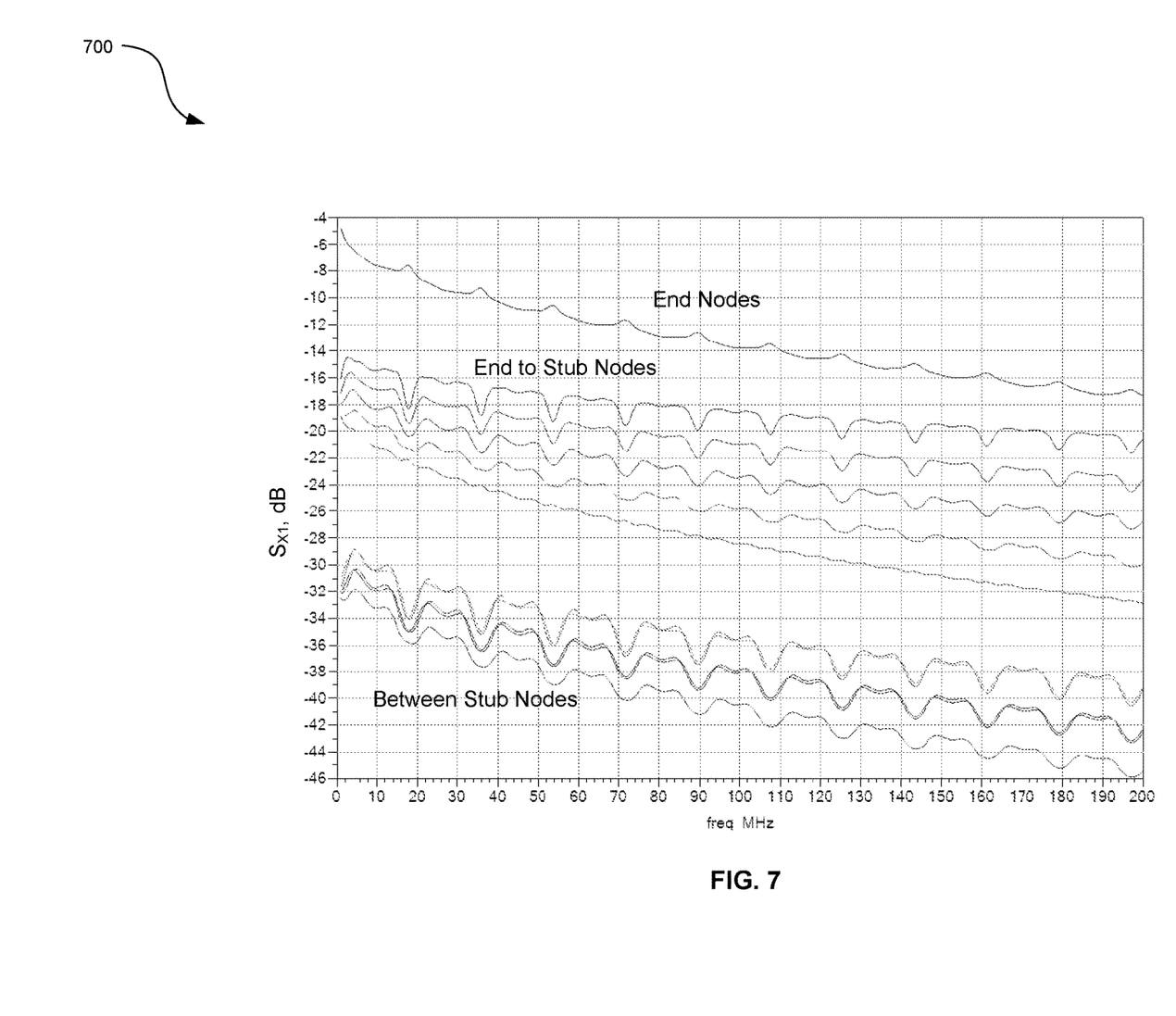
FIG. 7 illustrates the frequency response for a 30 meter bus with 10 meter stubs, in accordance with an example embodiment of the disclosure.

FIG. 7 illustrates the frequency response for a 30 meter bus with 10 meter stubs, in accordance with an example embodiment of the disclosure. Referring to FIG. 7, there is shown frequency response plot 700 with response curves for connections between each of the nodes, with the ripple being the same as the 30 meter embodiment with shorter stubs, in terms of ripple, but with higher roll-off with frequency. As with the previous structures, equalizers may be utilized at the nodes to compensate for the roll-off. Furthermore, the speed degradation is similar to the previous embodiments, with the lowest attenuation between end nodes and the highest attenuation between stub nodes. Ripple again ranges from 1-3 dB.

Figure 8:
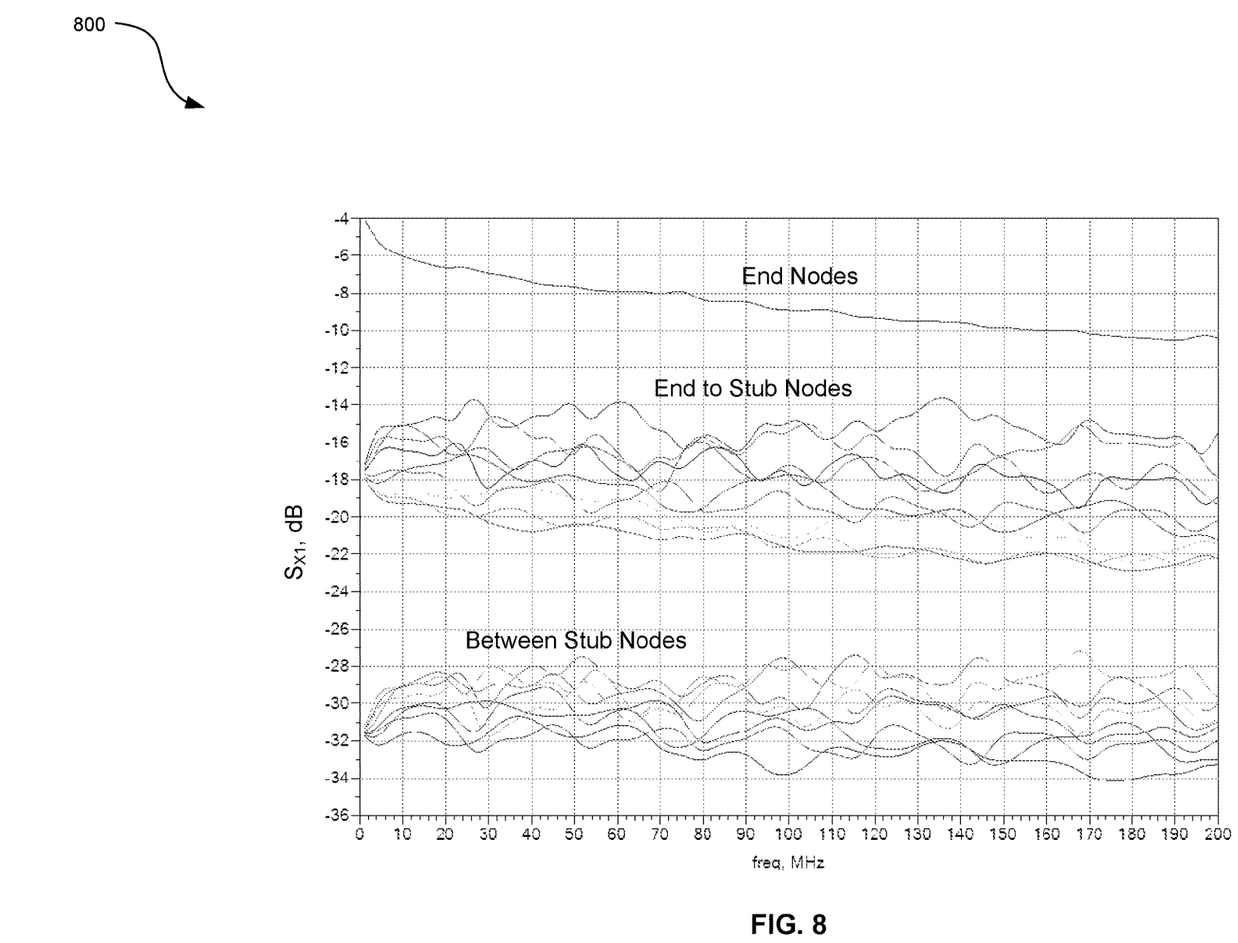
FIG. 8 illustrates the frequency response for a bus with random segment lengths, in accordance with an example embodiment of the disclosure.

FIG. 8 illustrates the frequency response for a bus with random segment lengths, in accordance with an example embodiment of the disclosure. Referring to FIG. 8, there is shown frequency response plot 800 with response curves for connections between each of the nodes, with the location of notches in the frequency plots being irregular but the ripple range, 1-3 dB, being approximately the same as other embodiments. As with the previous structures, equalizers may be utilized at the nodes to compensate for the roll-off.

Figure 9:
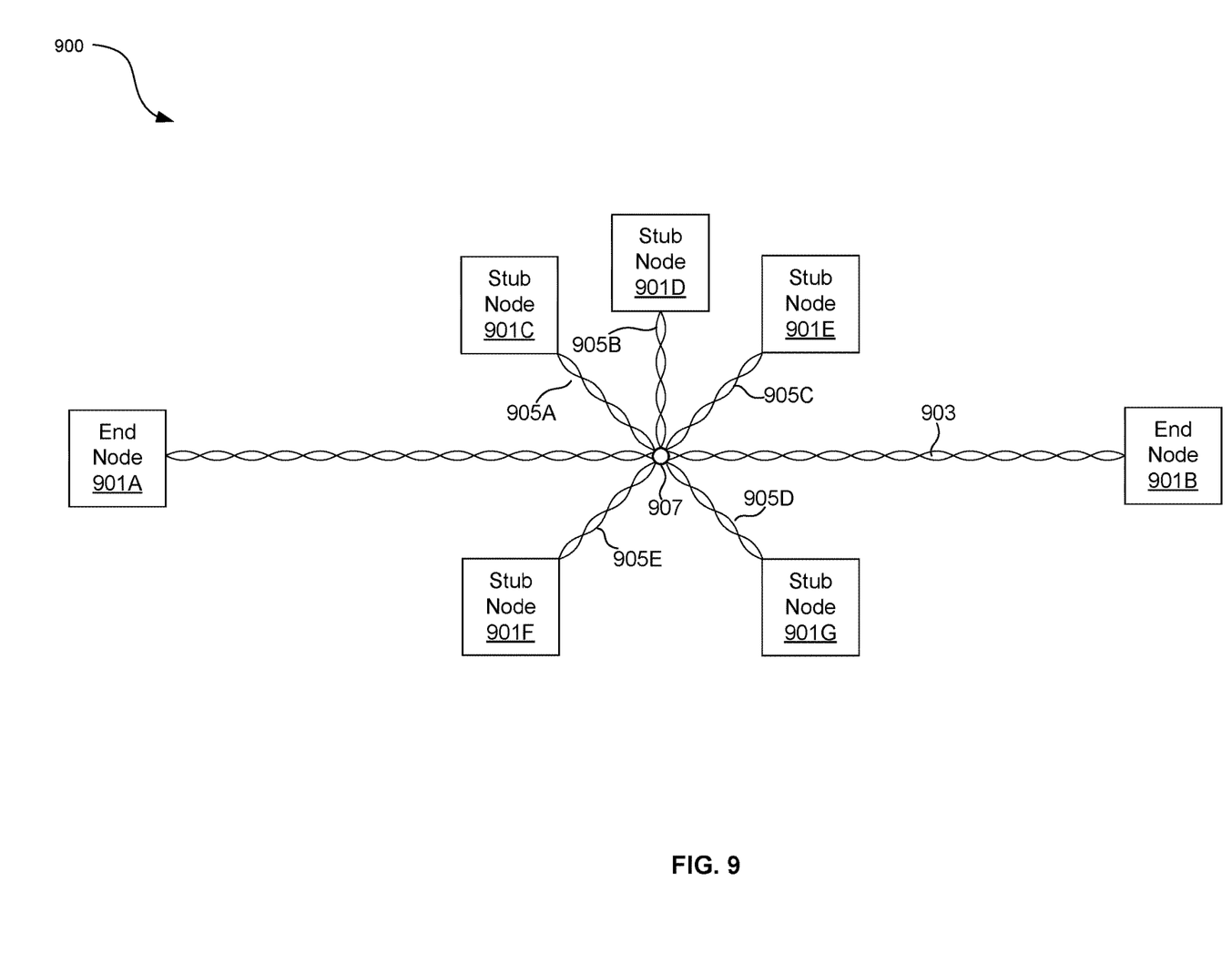
FIG. 9 illustrates a twisted pair bus with stubs coupled to a single star, in accordance with an example embodiment of the disclosure.

FIG. 9 illustrates a twisted pair bus with stubs coupled to a single star, in accordance with an example embodiment of the disclosure. Referring to FIG. 9, there is shown a twisted pair bus 900 with end nodes 901A and 901B, and stub nodes 901C-901G, all coupled to a single star junction 907. Each stub 901A-901G may comprise a pair of impedances at the junction with the main line. Termination at the star junction 907 may be removed and matching provided at the ends of the main line 903. In a star configuration, if stub impedance is not used, frequency response may still be acceptable. If stub impedance is used, attenuation levels may be similar to a linear topology with the same length of wire. All nodes (end and stub) may be terminated to the nominal line impedance. The resulting frequency response is shown in FIG. 10, as well as for a no-added-impedance bus.

To approximate a typical automotive application, the total length of the twisted pair from end nodes 901A to 901B may be 10-15 meters and the stubs may each be about 20 cm, all comprising 22 gauge wire, for example. As in FIGS. 1 and 3B, the end nodes 901A and 901B may comprise main system controllers, for example, and the stub nodes 901C-901G may comprise input devices such as sensors, cameras, or other devices that provide input to the controllers.

Figure 10:
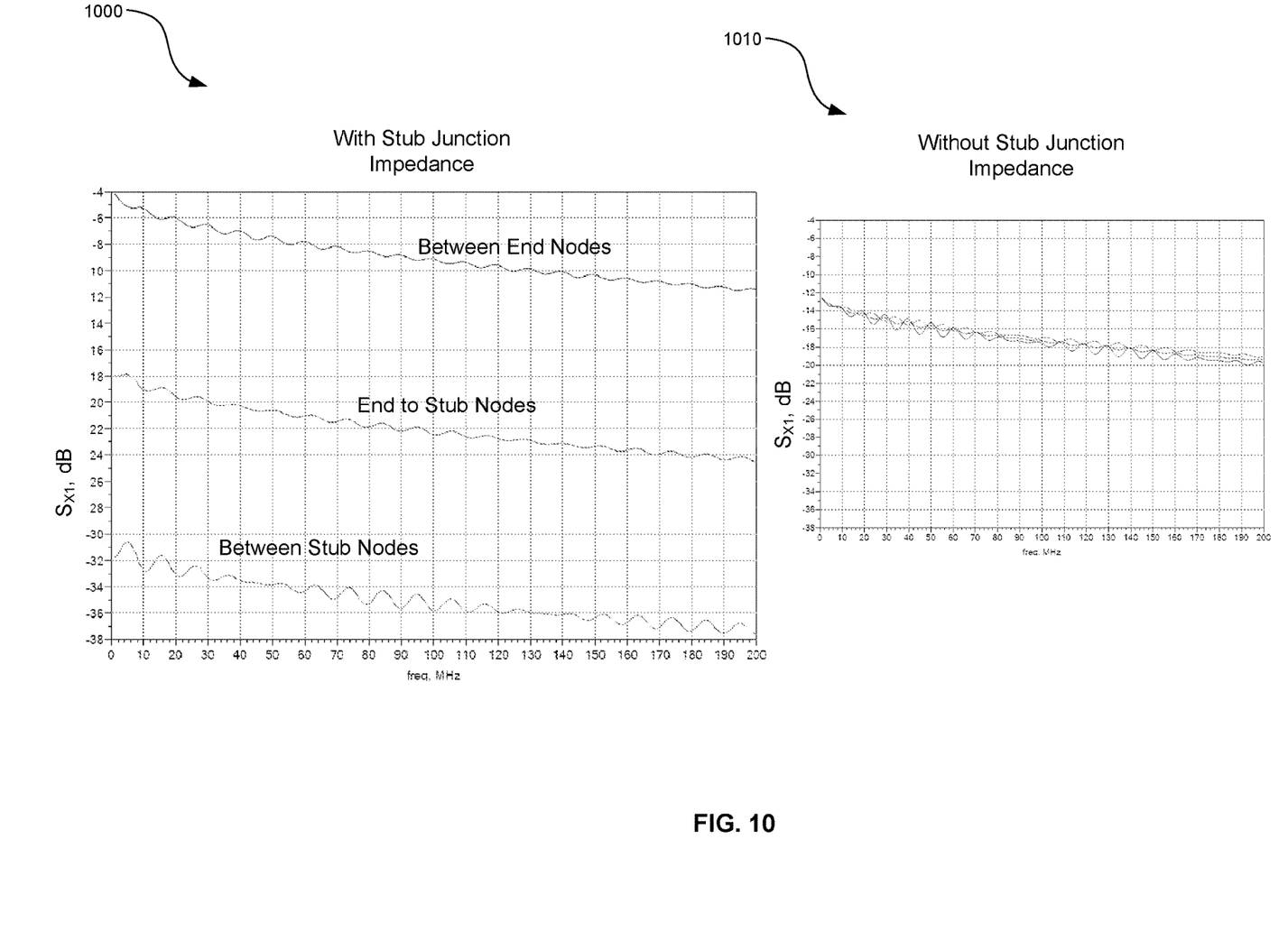
FIG. 10 illustrates the frequency response of a twisted pair bus with stubs coupled to a single star with and without junction node impedances, in accordance with an example embodiment of the disclosure.

FIG. 10 illustrates the frequency response of a twisted pair bus with stubs coupled to a single star with and without junction node impedances, in accordance with an example embodiment of the disclosure. Referring to FIG. 10, there is shown frequency response plot 1000 including frequency response for communication between various nodes in a single star bus with stub junction impedance included and frequency response plot 1010 including frequency response for communication between nodes without stub junction impedance. The ripple is less than 1 dB and the attenuation is less than 4 dB for end nodes 901A to 901B and attenuation of less than 24 dB for end nodes to star nodes 901C-901G. This topology may be used without impedances added at the junction to the main line, but limits the flexibility of the bus, as each is coupled to a single star.

Figure 11:
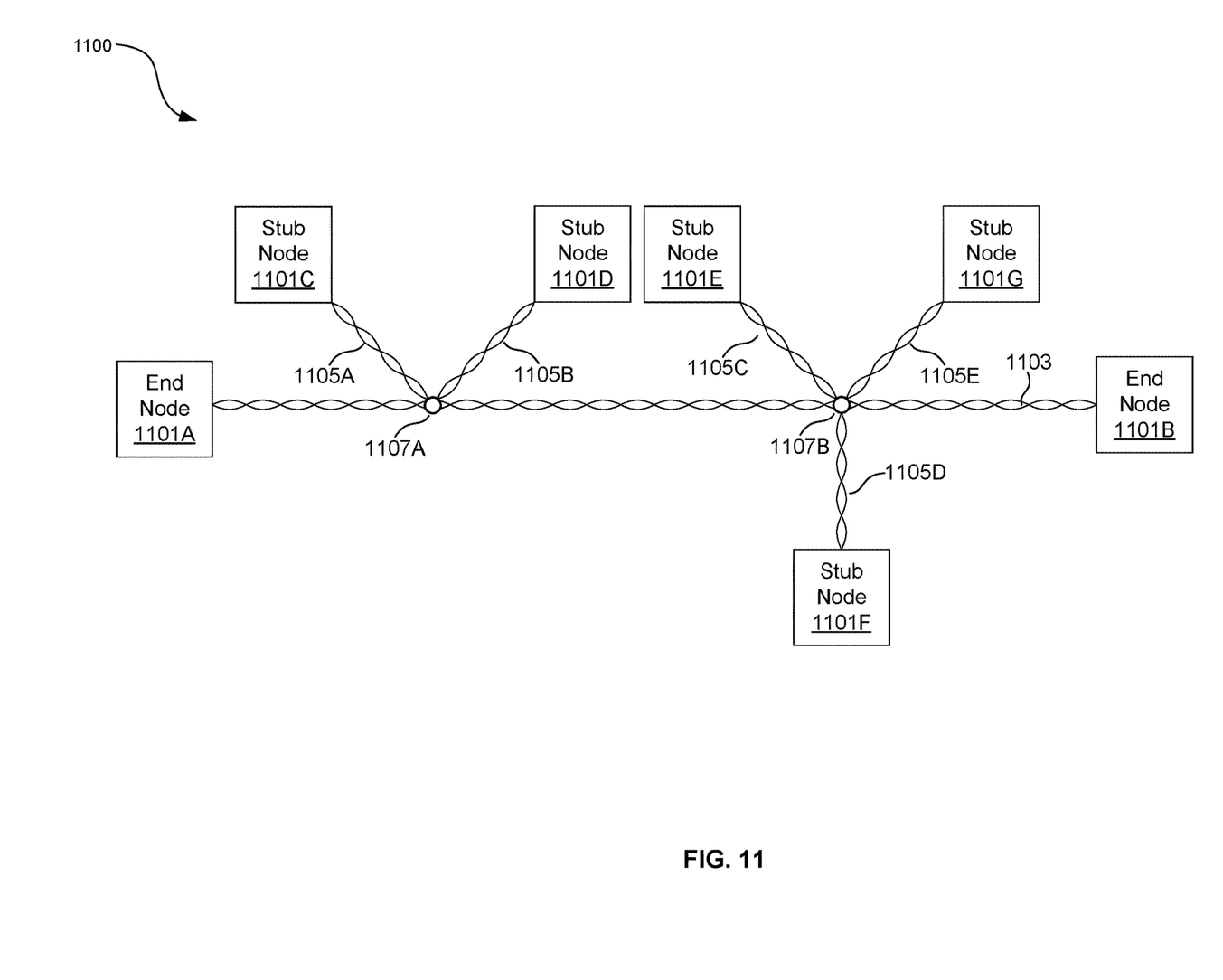
FIG. 11 illustrates a twisted pair bus with stubs coupled to two stars, in accordance with an example embodiment of the disclosure.

FIG. 11 illustrates a twisted pair bus with stubs coupled to two stars, in accordance with an example embodiment of the disclosure. Referring to FIG. 11, there is shown a twisted pair bus 1100 with end nodes 1101A and 1101B, and stub nodes 1101C-110G coupled to either of two stars 1107A and 1107B. Termination at the stars may be removed and matching provided by all nodes to nominal line impedance, where each stub 1105A-1105E comprises a pair of impedances at the star with the main line at the corresponding star 1107A or 1107B. To approximate a typical automotive application, the total length of the twisted pair from end nodes 1101A to 1101B may be 10-15 meters and the stubs may each be about 20 cm, all comprising 22 gauge wire, for example.

As in FIGS. 1, 3B, and 11, the end nodes 1101A and 1101B may comprise main system controllers, for example, and the stub nodes 1101C-1101G may comprise input devices such as sensors, cameras, or other devices that provide input to the controllers. The resulting frequency response is shown in FIG. 12.

Figure 12:
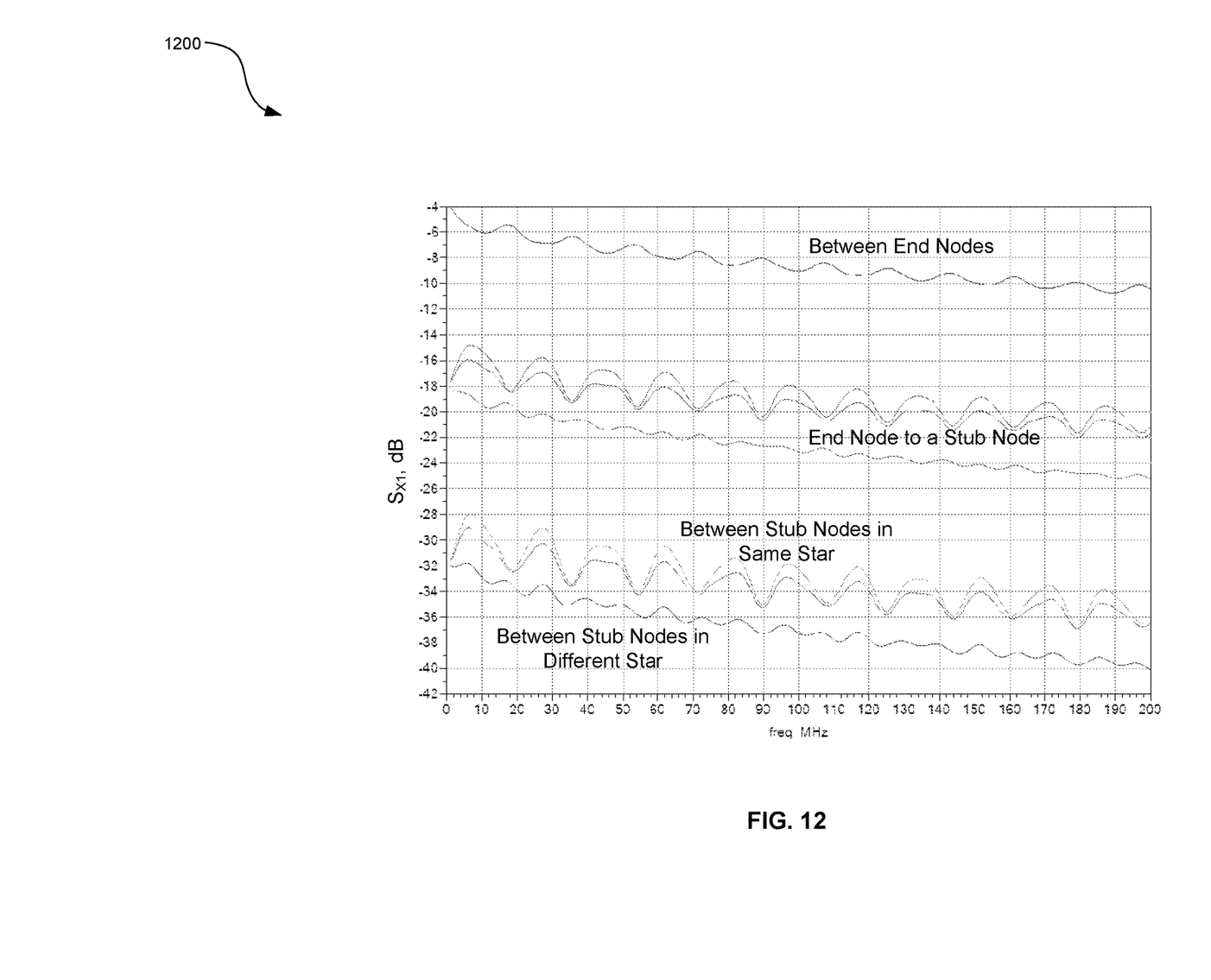
FIG. 12 illustrates the frequency response of a twisted pair bus with stubs coupled to two stars, in accordance with an example embodiment of the disclosure.

FIG. 12 illustrates the frequency response of a twisted pair bus with stubs coupled to two stars, in accordance with an example embodiment of the disclosure. Referring to FIG. 12, there is shown frequency response plot 1200 comprising frequency response curves for communication between various nodes in a two star bus. In this example, the ripple is higher than with a single star, but is a similar ripple and attenuation to a linear topology. Unlike the single star example, the dual star produces high ripple if stub impedance is not used, and is therefore does not achieve low ripple and low attenuation simultaneously.

Figure 13:
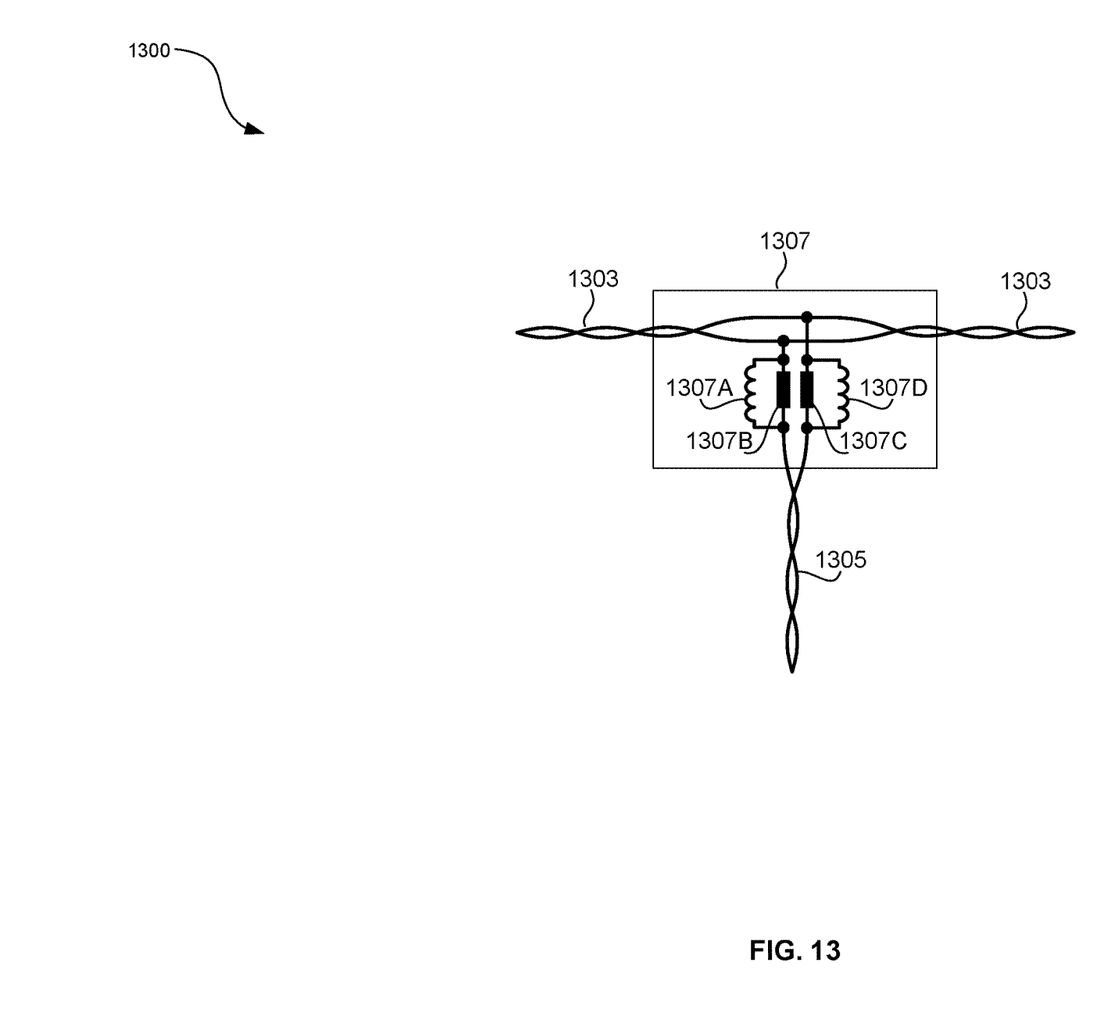
FIG. 13 illustrates a twisted pair bus with impedance matching circuit with DC bypass, in accordance with an embodiment of the disclosure.

FIG. 13 illustrates a twisted pair bus with impedance matching circuit with DC bypass, in accordance with an embodiment of the disclosure. Referring to FIG. 13, there is shown twisted pair bus 1300 comprising main line 1303, stub 1305, and junction 1307. As shown in FIG. 13, resistors 1307B and 1307C in parallel with inductors 1307A and 1307D may be incorporated into the junction 1307 with the stub line 1305 for coupling to the main line 1303. The junction impedances 1307A-1307D are not matching impedances necessarily, but prevent that stub's mismatch with the main line 1303, and reduce noise in the bus 1300. In other words, the main line 1303 of the bus 1300 may be matched to nodes while the stubs are not, but the stubs are generally short in comparison to the main line. Both the main line and the stubs are quasi adapted, allowing a moderate level of signal reflection that causes a manageable ripple for an OFDM modulation with variable bit-loading. In an example scenario, the resistors may each be in the 200-300 Ohm range, or about 2-3× the nominal impedance of the bus.

The inductors 1307A and 1307D provide DC bypass to allow for DC power to be coupled via the bus as well as data signals, which is an advantage of utilizing the G.hn communication protocol. As each of the devices at the nodes in the bus are powered from the same source and ground, AC coupling of devices is possible and there is no need for transformers to couple devices via the stubs. Example values for the impedances are 200-300Ω for the resistors and 22-56 μH for the inductors.

In an embodiment of the invention, a method and system are disclosed for a broadband bus in automotive applications and may comprise a twisted pair wiring bus comprising a main line for coupling two end nodes and one or more stub lines, each stub line coupling a stub node to the main line via a junction impedance on each wire in the stub line. The twisted pair wiring bus may be operable to communicate electrical signals between devices coupled to the end nodes and the stub nodes. A subset of the stub nodes may be coupled to the main line in a star configuration.

The junction impedance may comprise a resistor on each wire in the stub line where the resistor may have a resistance that is two to three times a nominal impedance of the main line. The junction impedance may comprise a resistor in parallel with an inductor on each wire in the stub line. The twisted pair wiring bus may be operable to provide DC power to one or more stub nodes via the inductor.

A plurality of subsets of the stub nodes may be coupled to the main line in a plurality of star configurations. The main line may be approximately 10 meters long and the stub lines may be less than a meter long, but here is no strict limitation. The longer the wires, the higher the droop versus frequency. The separation of the notches is inversely proportional to the separation of the stubs. The end nodes may comprise system controllers and the stub nodes comprise input devices that are operable to provide input to the system controllers. One of the end nodes may comprise a system controller and the other end node may have a termination impedance.

Accordingly, the present disclosure may be realized in hardware or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
in a twisted pair wiring bus comprising a main line for coupling two end nodes and one or more stub lines, the main line being directly coupled to the two end nodes, each stub line coupling a stub node to the main line via a junction impedance on each wire in the stub line:
communicating electrical signals between devices coupled to the end nodes and the stub nodes.

2. The method according to claim 1, wherein a subset of the stub nodes are coupled to the main line in a star configuration.

3. The method according to claim 1, wherein the junction impedance comprises a resistor on each wire in the stub line.

4. The method according to claim 3, wherein the resistor has a resistance that is two to three times a nominal impedance of the main line.

5. The method according to claim 1, wherein the junction impedance comprises a resistor in parallel with an inductor on each wire in the stub line.

6. The method according to claim 5, comprising providing DC power to one or more stub nodes via the inductor.

7. The method according to claim 1, wherein a plurality of subsets of the stub nodes are coupled to the main line in a plurality of star configurations.

8. The method according to claim 1, wherein the stub nodes comprise input devices that provide input to the system controllers.

9. The method according to claim 1, wherein the end nodes comprise system controllers.

10. The method according to claim 9, wherein one of the end nodes comprises a system controller and a second of the end nodes has a termination impedance.

11. A system for communication, the system comprising:
a twisted pair wiring bus comprising a main line for coupling two end nodes and one or more stub lines, the two end nodes being directly coupled to the main line, each stub line coupling a stub node to the main line via a junction impedance on each wire in the stub line, the twisted pair wiring bus being operable to:
communicate electrical signals between devices coupled to the end nodes and the stub nodes.

12. The system according to claim 11, wherein a subset of the stub nodes are coupled to the main line in a star configuration.

13. The system according to claim 11, wherein the junction impedance comprises a resistor on each wire in the stub line.

14. The system according to claim 13, wherein the resistor has a resistance that is two to three times a nominal impedance of the main line.

15. The system according to claim 11, wherein the junction impedance comprises a resistor in parallel with an inductor on each wire in the stub line.

16. The system according to claim 15, wherein the twisted pair wiring bus operable to provide DC power to one or more stub nodes via the inductor.

17. The system according to claim 11, wherein a plurality of subsets of the stub nodes are coupled to the main line in a plurality of star configurations.

18. The system according to claim 11, wherein one of the end nodes comprises a system controller and a second of the end nodes has a termination impedance.

19. The system according to claim 11, wherein the end nodes comprise system controllers and the stub nodes comprise input devices that are operable to provide input to the system controllers.

20. A system for communication, the system comprising:
a twisted pair wiring bus comprising a main line for coupling two end nodes and one or more stub lines, the main line being directly coupled to the two end nodes, each stub line coupling a stub node to the main line via a junction impedance comprising a resistor in parallel with an inductor on each wire in the stub line, the twisted pair wiring bus being operable to:
communicate electrical signals between devices coupled to the end nodes and the stub nodes.

* * * * *